US012640195B2

(12) United States Patent
Kumar et al.

(10) Patent No.: US 12,640,195 B2
(45) Date of Patent: May 26, 2026

(54) CIRCUITRY TO DETECT CYCLE COUNT FOR INCREASED THROUGHPUT READS AND WRITE OPERATIONS FOR MEMORY

(71) Applicant: Arm Limited, Cambridge (GB)

(72) Inventors: Akshay Kumar, New Delhi (IN); Edward Martin McCombs, Jr., Austin, TX (US)

(73) Assignee: ARM LIMITED, Cambridge (GB)

( * ) Notice: Subject to any disclaimer, the term of this patent is extended or adjusted under 35 U.S.C. 154(b) by 223 days.

(21) Appl. No.: 18/436,330

(22) Filed: Feb. 8, 2024

(65) Prior Publication Data

US 2025/0259673 A1      Aug. 14, 2025

(51) Int. Cl.
*G11C 8/08* (2006.01)
*G11C 11/418* (2006.01)
*G11C 11/419* (2006.01)

(52) U.S. Cl.
CPC .............. *G11C 11/419* (2013.01); *G11C 8/08* (2013.01); *G11C 11/418* (2013.01)

(58) Field of Classification Search
CPC ..... G11C 11/418; G11C 8/10; G11C 11/1655; G11C 11/2255; G11C 7/1039
USPC .................................................. 365/189.011
See application file for complete search history.

(56) References Cited

U.S. PATENT DOCUMENTS

| | | | | |
|---|---|---|---|---|
| 6,026,466 A * | 2/2000 | Su | ............................ | G11C 8/18 365/233.5 |
| 6,181,608 B1 | 1/2001 | Keshavarzi et al. | | |
| 6,181,612 B1 | 1/2001 | Wada | | |
| 2001/0043482 A1* | 11/2001 | Takeyama | ............ | G11C 7/1072 365/23 |
| 2020/0098422 A1 | 3/2020 | Nguyen et al. | | |
| 2021/0193196 A1 | 6/2021 | Augustine et al. | | |
| 2022/0230678 A1* | 7/2022 | Chakraborty | ......... | G11C 11/419 |
| 2025/0258609 A1* | 8/2025 | Kumar | .................. | G11C 11/419 |

FOREIGN PATENT DOCUMENTS

WO          2023034370 A1      3/2023

* cited by examiner

*Primary Examiner* — Anthan Tran
(74) *Attorney, Agent, or Firm* — Talem IP Law, LLP

(57) ABSTRACT

Control circuitry for memory includes a state machine including a number of state elements corresponding to a maximum number of available columns of a blast operation for memory; a set of registers including a corresponding register for each state element; and a column selection control circuit that combines outputs of the state machine and the set of registers to trigger an appropriate column during an appropriate clock cycle, available at a start of a corresponding clock cycle. The state machine receives a clock and various inputs associated with a start of memory operations and provides intermediate state element outputs and a final state element output as the outputs. Each register of the set of registers is available to store, from an address enable signal, a value indicating that a column in memory to which that register corresponds is to be accessed.

20 Claims, 9 Drawing Sheets

CIRCUITRY TO DETECT CYCLE COUNT FOR INCREASED THROUGHPUT READS AND WRITE OPERATIONS FOR MEMORY

BACKGROUND

Random Access Memory (RAM) is a type of volatile memory typically used as the main or primary memory for a processing unit and stores the programs and data that the processing unit is using during execution of a program. Static Random Access Memory (SRAM) is typically the type of memory used for caches. SRAM is generally configured as an array, or matrix, of memory units that are individually addressable. Read and write operations are performed on units of data referred to as words. That is, a word refers to a unit of data used by a particular processor design or instruction set.

In general, wordlines are used to select a row for reading or writing and bitlines carry data to/from a column. For the read operation in SRAM, the address of a storage location for a word is transferred to an address line, a pre-charge circuit is used to bring bitlines to VDD, the wordline is driven high (pre-charge circuit is turned off), the cells storing the data at the storage location pull down one bitline, and a sense circuit on a periphery of the array is activated to capture the value on the bitlines. For the write operation in SRAM, the address of a desired word is transferred to a specific address on the wordline and column, data bits to be stored in the memory are transferred to the bitlines, which are driven by a column driver circuit, and the write control is activated to drive the wordline high (while the column driver stays on) and drive the data into the cells being written.

The speed of a processing unit is determined by how many calculations a processor can perform per clock cycle. However, one limiting factor to the performance of a processing unit is the speed at which the data stored in memory can be read and written. Row and column changes, changing between commands, and other operations can contribute to higher latencies. Identifying mechanisms to reduce the number of clock cycles to deliver data (both to memory as a write operation and to a processing unit as a read operation) continues to be important for performance.

BRIEF SUMMARY

Circuitry to detect cycle count for increased throughput reads and write operations for memory are described.

An increased throughput refers to the ability to write, read, and access multiple bitcells of a memory in fewer clock cycles compared to the writing, reading, or accessing of the multiple bitcells individually. A "blast mode" is provided in which more than one word is written or read on a given wordline across multiple columns which results in increased throughput.

Control circuitry for increased throughput read and write operations includes a state machine with a number of state elements corresponding to a maximum number of available columns of the blast operation, wherein the state machine is structured to receive a clock and an input associated with a start of memory operations and provide intermediate state element outputs and a final state element output; a set of registers including a corresponding register for each state element such that the set of registers has a number of registers corresponding to the maximum number of available columns of the blast operation, wherein each register of the set of registers is available to store, from an address enable signal, a value indicating that a column in memory to which that register corresponds is to be accessed; and a column selection control circuit that combines outputs of the state machine and the set of registers to trigger an appropriate column during an appropriate clock cycle, available at a start of a corresponding clock cycle.

A memory circuitry including the above control circuitry can further include a wordline driver for a memory, the wordline driver coupled to receive an address and select a corresponding wordline for the memory; and input/output circuitry comprising read circuitry and write circuitry. The above described control circuitry can operate the wordline driver and the input/output circuitry.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Circuitry to detect cycle count for increased throughput reads and write operations for memory are described. An increased throughput refers to the ability to write, read, and access multiple bitcells of a memory in fewer clock cycles compared to the writing, reading, or accessing of the multiple bitcells individually. A "blast mode" is provided in which more than one word is written or read on a given wordline across multiple columns which results in increased throughput.

Figure 1A:
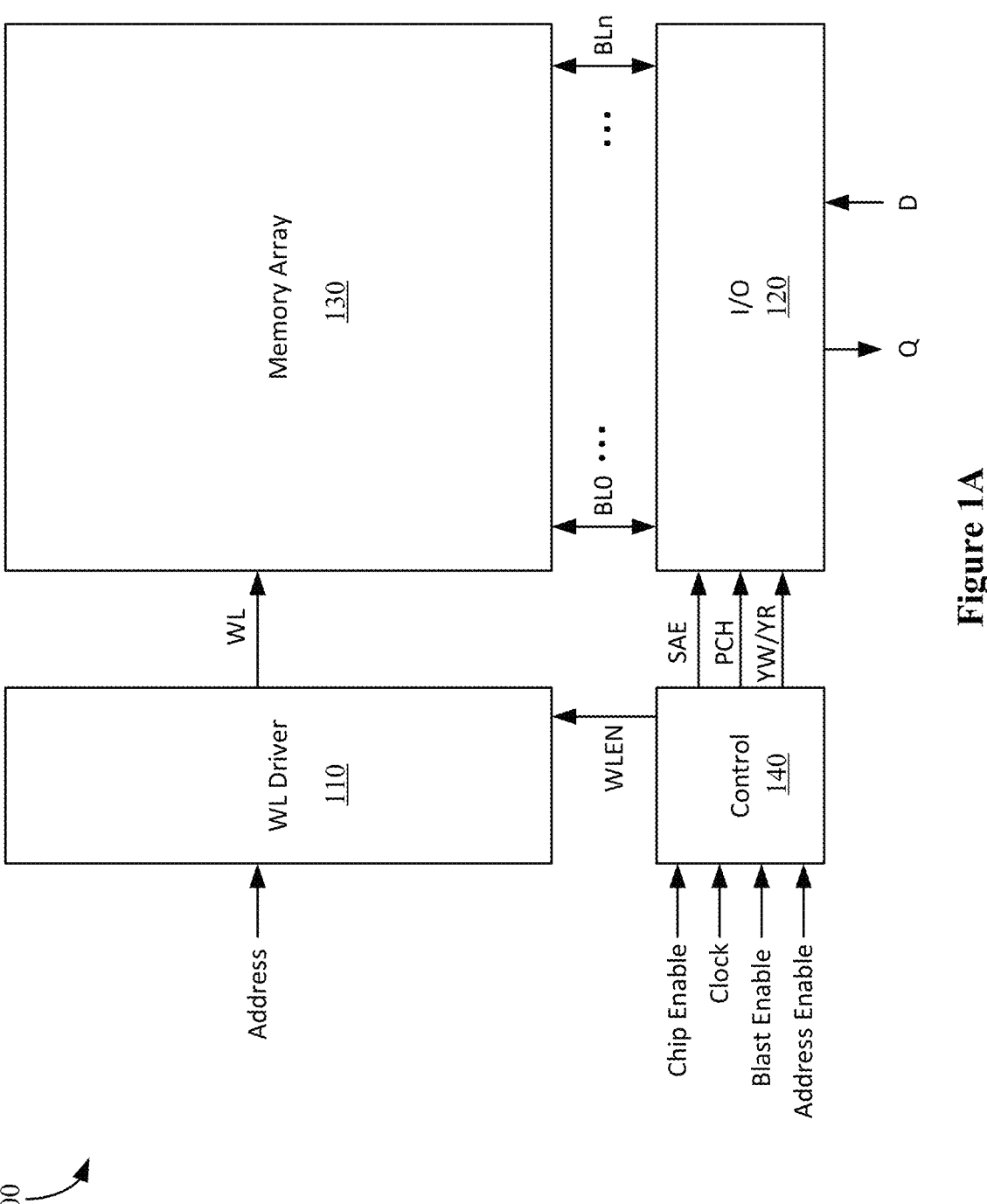
FIG. 1A shows a representational diagram of a memory circuitry.

FIG. 1A shows a representational diagram of a memory circuitry.

Referring to FIG. 1A, memory circuitry 100 includes a wordline (WL) driver 110 and input/output circuitry 120 for a memory array 130. The WL driver 110 and the input/output circuitry 120 operate under the control of a control circuit 140. In some implementations, the memory circuitry 100 is cache circuitry.

The memory 130 is structured in an array with rows accessed by wordlines and columns accessed by bitlines. In certain implementations, the memory 130 is a static random access memory (SRAM). The structure of each bitcell of the memory can be 1:1:1 bitcells, 1:1:2 bitcells, or 1:2:2 bitcells, as examples. The bitcells may be implemented in FinFET processes, planar processes, nanosheet processes, FDSOI processes, or other suitable technologies. A bitcell refers to the memory element storing a single bit of information.

The control circuit 140 can receive a chip enable signal, a clock signal, a blast enable signal, and an address enable signal and generate outputs to control the WL driver 110 and the I/O circuitry 120. The chip enable signal indicates whether the memory will be accessed or not. The clock signal indicates the start of an operation for memory and provides the operating frequency for the circuitry. The blast enable signal indicates whether the operation being performed at the memory is in blast mode. The address enable signal supports out-of-order bitcell access. Out-of-order bitcell access refers to the ability to write or read (or otherwise access) bitcells on a non-consecutive basis. That is, by using the address enable signal, which indicates which bitlines are going to be accessed during the blast mode, it is possible to have multiple words read or written to non-consecutive bitcells of a row.

The WL driver 110 receives an address and turns on a wordline indicated by the address in response to receiving a wordline enable (WLEN) signal from the control circuit 140.

The input/output circuitry 120 can include write circuitry and read circuitry. Data (D) is received for write operations and Data (Q) is output for read operations. The input/output circuitry 120 receives a sense amplifier enable (SAE) signal, a precharge (PCH) signal, and a column select (YW/YR) signal from the control circuit 140. In the case of write operations, the control circuit 140 provides a precharge (PCH) signal and a write column select (YW) signal to write circuitry. In the case of read operations, the control circuit 140 provides a sense amplifier enable (SAE) signal, a precharge (PCH) signal, and a read column select (YR) signal to read circuitry.

The control circuit 140 can include circuitry supporting blast operations, including the various configurations described with respect to FIGS. 3A, 3B, 4, 5, 6, and 7.

Internal control circuitry of control circuit 140 sequences the control inputs to the memory array in a manner that allows for the memory operation to be performed. In various implementations, the internal control circuitry is designed with an optimization goal of a minimum overhead in terms of area, leakage, and power. To assist with blast operations, which allow for increased throughput that not only vary in the numbers of words written/read but also support non-consecutive bitcell accesses, control signals specify whether a cycle is a first cycle in the operation (based on the chip enable signal and the clock signal) and for each upcoming cycle in the blast operation, which column is to be accessed.

A rigid sequence on the control signals can be provided. For example, for a blast read operation, the control circuit 140 can output, in sequence, a bitline precharge signal and sense amplifier precharge signal (which are usually triggered at the same time), a column select signal (NYR), and a sense amplifier enable (SAE) signal. The sequence of control signals may further include the sense amplifier precharge signal, a next column select signal, and a next sense amplifier enable signal.

Figure 1B:
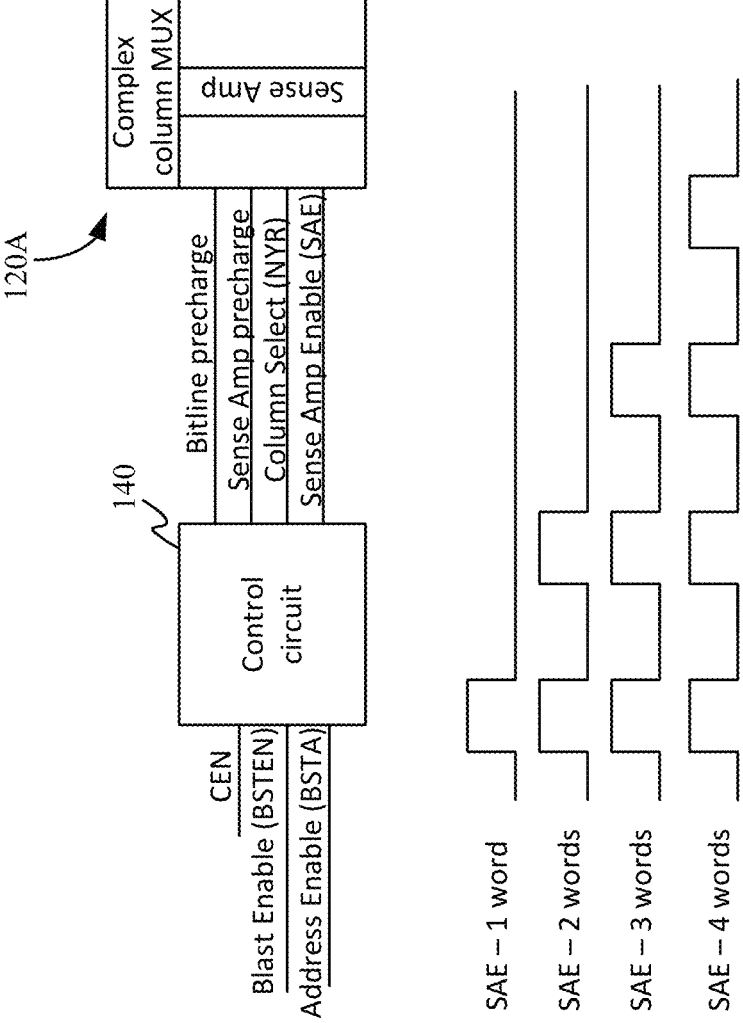
FIG. 1B illustrates control signals supporting reading operations.

FIG. 1B illustrates control signals supporting reading operations. Referring to FIG. 1B, control circuit 140 receives a chip enable (CEN) signal, a blast enable (BSTEN) signal, and an address enable (BSTA) signal and outputs a bitline precharge signal, sense amplifier precharge signal, multiple column select (NYR) signals, and sense amplifier enable (SAE) signal to read circuitry 120A of the input/output circuitry 120. Read circuitry 120A can include a complex column multiplexer, which is controlled by the control circuit 140, including the various circuitry shown in FIGS. 3A, 3B, 4, 5, and 6. The complex column multiplexer supports in-order and out-of-order (i.e., non-consecutive) column selection.

For a multi-cycle operation such as a blast read of at least two words, the sense amplifier is enabled and precharged for each word being read. Thus, sense amplifier precharge logic should scale like the sense amplifier enable signal in order to handle the varying sized blasts. For example, as shown in the timing diagram, the sense amplifier enable (SAE) signal has one pulse for one word, two pulses for two words, three pulses for three words, and four pulses for four words, etc. The sense amplifier precharge signal is likewise applied. Indeed, the control of the sense amplifier precharge signal also depends on the number of words being read during the read operation (e.g., one, two, three, or four, etc.). Because the number of words being read may vary between different read operations, circuitry to detect cycle count is provided and this circuitry can be used to ensure that the sense amplifier precharge signal (as well as other signals such as the column select signals) are applied as needed (e.g., not too few or too many cycles).

Figure 2:
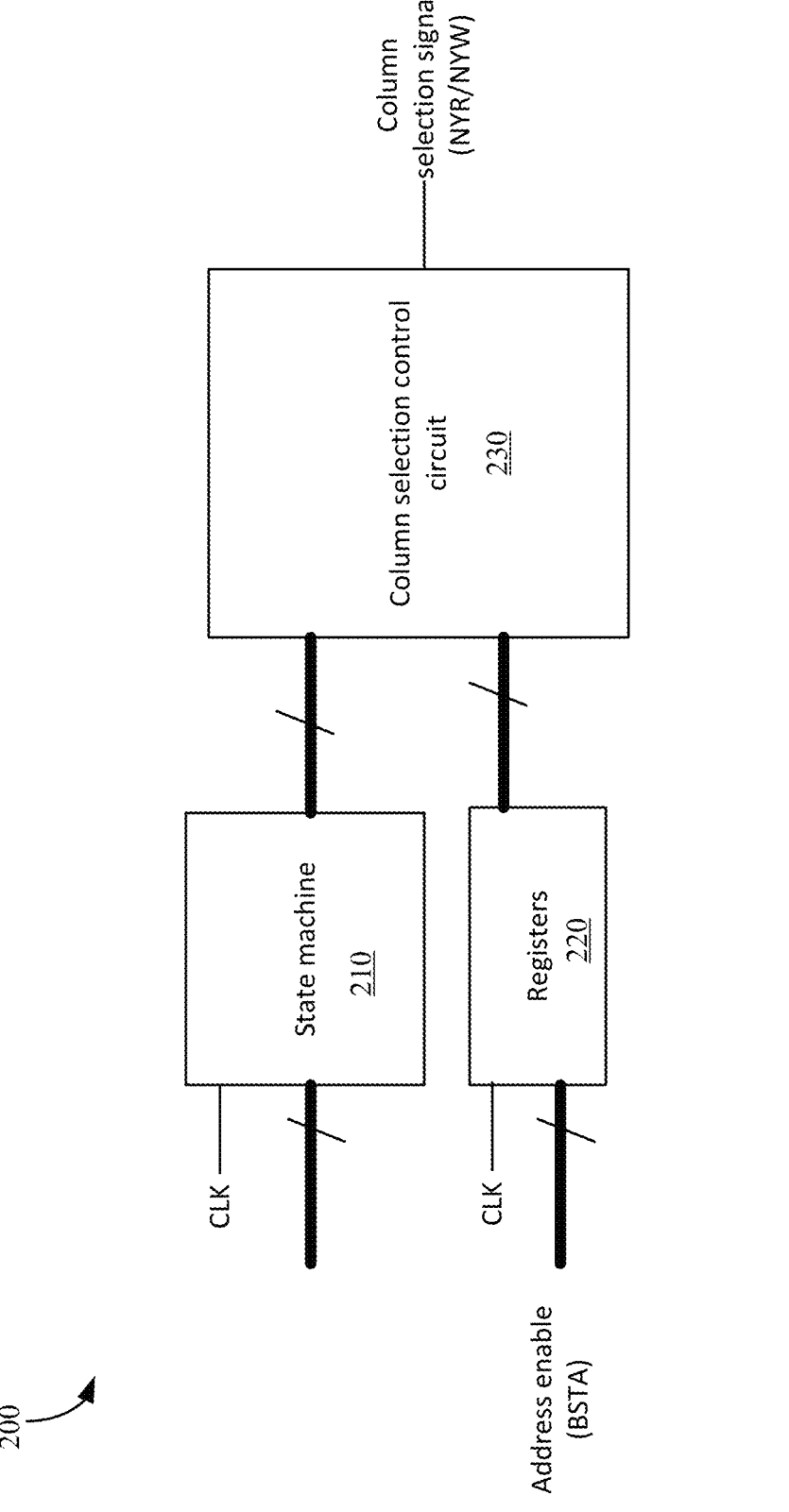
FIG. 2 shows a representative control circuit for generating column selection signals.

FIG. 2 shows a representative control circuit for generating column selection signals. Referring to FIG. 2, control circuit 200, which can be used in control circuit 140 as in FIGS. 1A and 1B, includes a state machine 210, a set of registers 220, and a column selection control circuit 230. The state machine 210 includes a number of state elements corresponding to a maximum number of available columns of a blast operation for memory. The state machine is structured to receive a clock (CLK) and an input associated with a start of memory operations and to output intermediate state element outputs and a final state element output. The state machine 210 may be implemented based on the state machine shown in FIG. 6.

The set of registers 220 includes a corresponding register for each state element of the state machine 210 such that the set of registers 220 has a number of registers corresponding to the maximum number of available columns of the blast operation for the memory. Each register of the set of registers 220 is available to store, from an address enable signal (BSTA), a value indicating which column(s) in memory to which that register corresponds is to be accessed. The address enable signal (BSTA) provides out-of-order bitcell access by indicating non-consecutive columns to be written or read, whereby a state of the set of registers directs the column selection control circuit 230 to trigger non-consecutive columns during consecutive clock cycles.

The column selection control circuit 230 combines outputs of the state machine 210 and the set of registers 220 to generate the control signals that can trigger an appropriate column during an appropriate clock cycle, available at a start of a corresponding clock cycle.

The column selection control circuit 230 can include a first stage combining outputs of the set of registers 220 with outputs of the state machine 210 to generate position signals for each register value of the set of registers; a second stage of logic structured to receive position signals from the first stage and outputs of the set of registers 220 and to output a cycle number signal; and a third stage of logic structured to receive the cycle number signal from the second stage and the output of the set of registers 220 and provide a column select signal for triggering an appropriate column during a particular clock cycle indicated by the cycle number signal and the state of the set of registers 220.

Figure 3A:
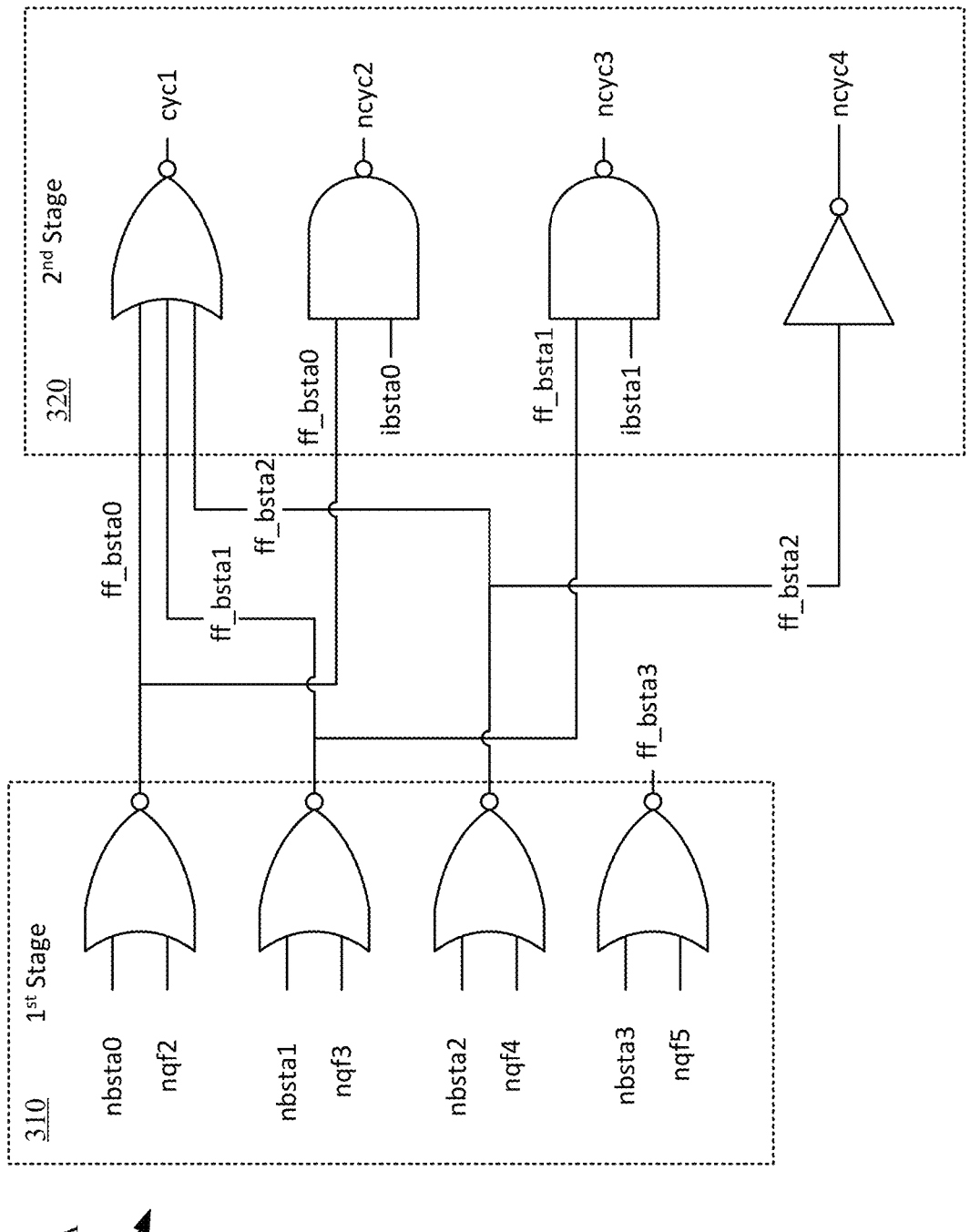
FIGS. 3A-3B illustrate example circuitry that can implement the column selection signal control circuitry.
Figure 3B:
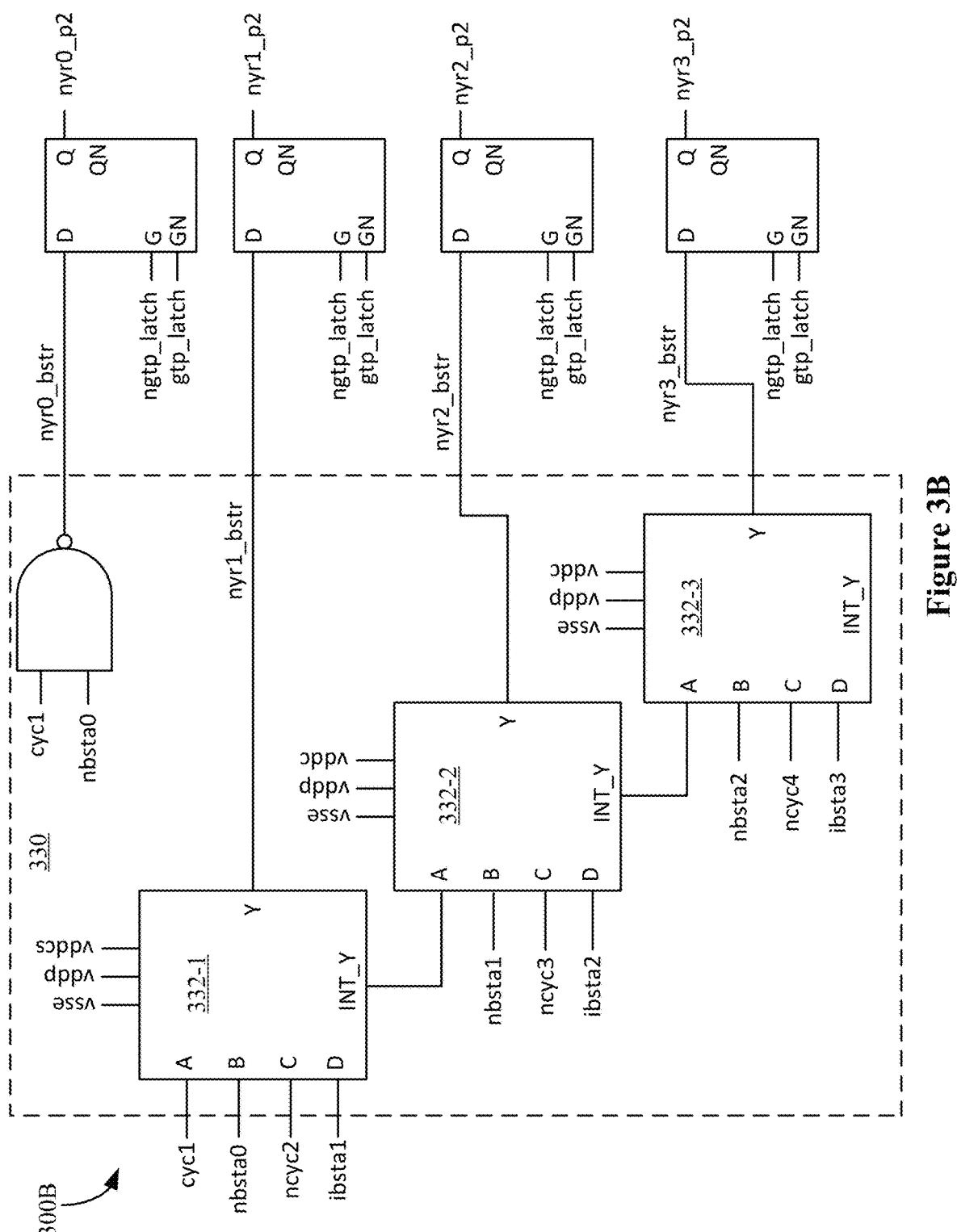
Figure 4:
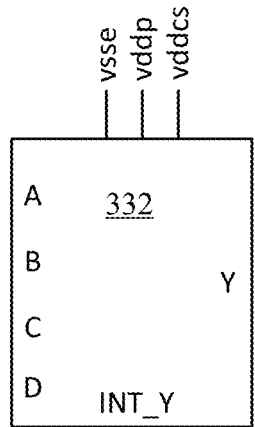
FIG. 4 illustrates an implementation of one of the circuit blocks shown in FIG. 3B.
Figure 4:
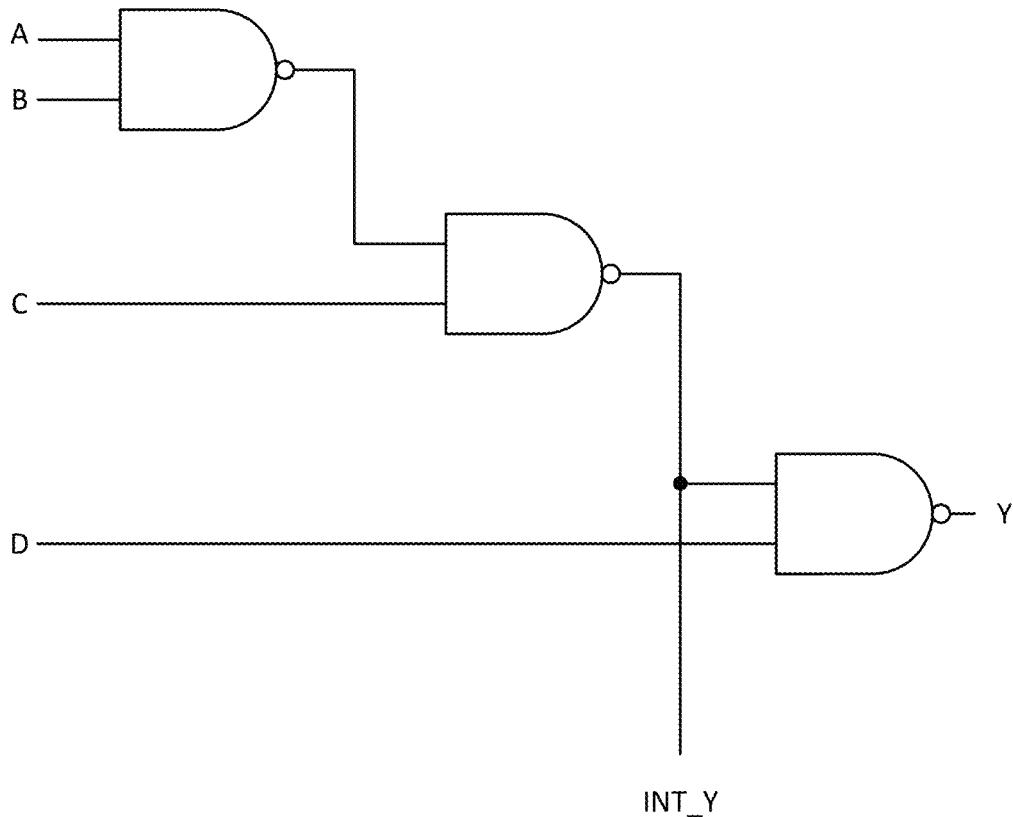

In some cases, column selection control circuit 230 is implemented as described with respect to FIGS. 3A, 3B, and 4. FIGS. 3A-3B illustrate example circuitry that can implement the column selection signal control circuitry; and FIG. 4 illustrates an implementation of one of the circuit blocks shown in FIG. 3B.

For example, on the rising edge of CLK when CEN=0, the value of BSTEN (Blast Enable), GWEN (Global Write Enable) and BSTA (Blast Address) can be captured into the set of registers 220 inside the memory. In the illustrative embodiment, state machine 210 can be implemented inside the memory as 4 shift registers with outputs NQF2, NQF3, NQF4 and NQF5, as illustrated with respect to FIG. 6. The outputs of the state machine shift registers trigger on the rising edge of CLK.

1. The first stage of the cycle detection circuitry generates outputs FF_BSTA0/1/2/3 by combining the BSTA0/1/2/3 signals with NQF2/3/4/5 respectively.
2. The output FF_BSTA0 goes high if BSTA0=1 and NYR0 was active (i.e., low) in the previous cycle.
3. The following truth table shows which NYR should be triggered in which cycle based on the possible values of BSTA:

6 c. This is the $3^{rd}$ cycle and BSTA3&(2 out of BSTA0/1/2 are high)

d. This is the $4^{th}$ cycle and BSTA3&BSTA2&BSTA1&BSTA0.

Based on the above, it can be seen that column selection control circuit 230 can include a first stage combining outputs of the set of registers (nbsta0-3) with outputs of the state machine (nqf2-5) to generate position signals (ff_bsta0-3) for each register value of the set of registers; a second stage comprising logic structured to receive position signals (ff_bsta0-3) from the first stage and outputs of the set of registers (such as ibsta0-3 and nbsta0-3) and output a cycle number signal (cyc1-3); and a third stage comprising logic structured to receive the cycle number signal from the second stage and the output of the set of registers and provide a column select signal for triggering an appropriate column during a particular clock cycle indicated by the cycle number signal and the state of the set of registers.

In the first stage, an output of a first register corresponding to a first column position (nbsta0) and an intermediate

| BSTA3 | BSTA2 | BSTA1 | BSTA0 | Operation spans over # cycles | NYR3 | NYR2 | NYR1 | NYR0 |
|---|---|---|---|---|---|---|---|---|
| 0 | 0 | 0 | 0 | | | INVALID | | |
| 0 | 0 | 0 | 1 | 1 | H | H | H | L in $1^{st}$ cycle |
| 0 | 0 | 1 | 0 | 1 | H | H | L in $1^{st}$ cycle | H |
| 0 | 0 | 1 | 1 | 2 | H | H | L in $2^{nd}$ cycle | L in $1^{st}$ cycle |
| 0 | 1 | 0 | 0 | 1 | H | L in $1^{st}$ cycle | H | H |
| 0 | 1 | 0 | 1 | 2 | H | L in $2^{nd}$ cycle | H | L in $1^{st}$ cycle |
| 0 | 1 | 1 | 0 | 2 | H | L in $2^{nd}$ cycle | L in $1^{st}$ cycle | H |
| 0 | 1 | 1 | 1 | 3 | H | L in $3^{rd}$ cycle | L in $2^{nd}$ cycle | L in $1^{st}$ cycle |
| 1 | 0 | 0 | 0 | 1 | L in $1^{st}$ cycle | H | H | H |
| 1 | 0 | 0 | 1 | 2 | L in $2^{nd}$ cycle | H | H | L in $1^{st}$ cycle |
| 1 | 0 | 1 | 0 | 2 | L in $2^{nd}$ cycle | H | L in $1^{st}$ cycle | H |
| 1 | 0 | 1 | 1 | 3 | L in $3^{rd}$ cycle | H | L in $2^{nd}$ cycle | L in $1^{st}$ cycle |
| 1 | 1 | 0 | 0 | 2 | L in $2^{nd}$ cycle | L in $1^{st}$ cycle | H | H |
| 1 | 1 | 0 | 1 | 3 | L in $3^{rd}$ cycle | L in $2^{nd}$ cycle | H | L in $1^{st}$ cycle |
| 1 | 1 | 1 | 0 | 3 | L in $3^{rd}$ cycle | L in $2^{nd}$ cycle | L in $1^{st}$ cycle | H |
| 1 | 1 | 1 | 1 | 4 | L in $4^{th}$ cycle | L in $3^{rd}$ cycle | L in $2^{nd}$ cycle | L in $1^{st}$ cycle |

Therefore, the NYRi triggering follows the following rules:

1. NYR0 should be triggered if:
   a. This is the $1^{st}$ cycle and BSTA0=1.
2. NYR1 should trigger if:
   a. This is the $1^{st}$ cycle and BSTA1&!BSTA0
   b. This is the $2^{nd}$ cycle and BSTA1&BSTA1.
3. NYR2 should trigger if:
   a. This is the $1^{st}$ cycle and BSTA2&!BSTA1&!BSTA0.
   b. This is the $2^{nd}$ cycle and BSTA2&(BSTA1+BSTA0)
   c. This is the $3^{rd}$ cycle and BSTA2&BSTA1&BSTA0
4. NYR3 should trigger if:
   a. This is the $1^{st}$ cycle and BSTA3&!BSTA2&!BSTA1&!BSTA0.
   b. This is the $2^{nd}$ cycle and BSTA3&(BSTA2+BSTA1+BSTA0)

output of a first state machine element (nqf2) are combined to a first position signal (ff_bsta0); an output of a second register corresponding to a second column position (nbsta1) and an intermediate output of a second state machine element (nqf3) are combined to a second position signal (ff_bsta1); an output of a third register corresponding to a third column position (nbsta2) and an intermediate output of a third state machine element (nqf4) are combined to a third position signal (ff_bsta2); and an output of a fourth register corresponding to a fourth column position (nbsta3) and the final output of a fourth state machine element (nqf5) are combined to a fourth position signal (ff_bsta3). In the circuit portion 300A of a control circuit shown in FIG. 3A, the first stage 310 includes NOR gates to combine the inputs and generate the position signals.

Referring to the circuit 300A of FIG. 3A, it can be seen that the first stage 310 includes a first NOR gate structured to receive the output of a first register corresponding to the first column position (nbsta0) and the intermediate output of the first state machine element (nqf2) and output the first position signal (ff_bsta0); a second NOR gate structured to receive the output of the second register corresponding to the second column position (nbsta1) and the intermediate output of the second state machine element (nqf3) and output the second position signal (ff_bsta1); a third NOR gate structured to receive the output of the third register corresponding to the third column position (nbsta2) and the intermediate output of the third state machine element (nqf4) and output the third position signal (ff_bsta2); and a fourth NOR gate structured to receive the output of the fourth register corresponding to the fourth column position (nbsta3) and the final output of the fourth state machine element (nqf5) and output the fourth position signal (ff_bsta3).

In the second stage, the cycle number signal (cyc1) for a first cycle is high if the first position signal (ff_bsta0), the second position signal (ff_bsta1), and the third position signal (ff_bsta2) are all low; the cycle number signal for a second cycle (ncyc2) is high if the first position signal (ff_bsta0) and the output of the first register (ibsta0) are both high; the cycle number signal for a third cycle (ncyc3) is high if the second position signal (ff_bsta1) and the output of the second register (ibsta1) are both high; and the cycle number signal for a fourth cycle (ncyc4) is high if the third position signal (ffbsta2) is high. In the circuit portion 300A of the control circuit shown in FIG. 3A, the second stage 320 includes a first NOR gate that receives the first position signal (ff_bsta0), the second position signal (ff_bsta1), and the third position signal (ff_bsta2); a first NAND gate that receives the first position signal (ff_bsta0) and the output of the first register (ibsta0); a second NAND gate that receives the second position signal (ff_bsta1) and the output of the second register (ibsta1); and an inverter that receives the third position signal (ff_bsta2).

In the third stage, the rules described with respect to the truth table above are implemented. For example, a first column select signal is triggered if the cycle number signal for a first cycle is high and the output of the first register is high; a second column select signal is triggered if the cycle number signal for the first cycle is high, the output of the first register is not high, and the output of the second register is high; and the second column select signal is triggered if the cycle number signal for a second cycle is high and the outputs of the first register and the second register are high.

Referring to the circuit portion 300B of the control circuit shown in FIG. 3B, it can be seen that the third stage 330 can include a NAND gate receiving the cycle number signal for the first cycle (cyc1) and an inverted output of the first register (nbsta0) to trigger the first column select signal (nyr0_bstr); a first four-input cascaded logic gate 332-1 receiving the cycle number signal for the first cycle (cyc1), the inverted output of the first register (nbsta0), an inverted cycle number signal for the second cycle (ncyc2), and the output of the second register (ibsta1) to trigger the second column select signal (nyr1_bstr); a second four-input cascaded logic gate 332-2 receiving an intermediate output of the first four-input cascaded logic gate 332-1, an inverted output of the second register (nbsta1), an inverted cycle number signal for the third cycle (ncyc3), and the output of the third register (ibsta2) to trigger the third column select signal (nyr2_bstr); and a third four-input cascaded logic gate 332-3 receiving an intermediate output of the second four-input cascaded logic gate 332-2, an inverted output of the third register (nbsta2), an inverted cycle number signal for the fourth cycle (ncyc4), and the output of the fourth register (ibsta3) to trigger the fourth column select signal (nyr3_bstr).

As shown in FIG. 4, the four-input cascaded logic gate 332 used for the first four-input cascaded logic gate 332-1, the second four-input cascaded logic gate 332-2, and the third four-input cascaded logic gate 332-3 can include: a first two-input NAND gate receiving a first input and a second input of that four-input cascaded logic gate; a second two-input NAND gate receiving an output of the first two-input NAND gate and a third input of that four-input cascaded logic gate; and a third two-input NAND gate receiving an output of the second two-input NAND gate and a fourth input of that four-input cascaded logic gate, where the output of the second two-input NAND gate is the intermediate output of that four-input cascaded logic gate.

Returning to FIG. 3B, the control circuit can further include a first output latch (output=nyr0_p2) coupled to the output of the NAND gate (nyr0_bstr); a second output latch (output=nyr1_p2) coupled to the output of the first four-input cascaded logic gate (nyr1_bstr); a third output latch (output=nyr2_p2) coupled to the output of the second four-input cascaded logic gate (nyr2_bstr); and a fourth output latch (output=nyr3_p2) coupled to the output of the third four-input cascaded logic gate (nyr3_bstr).

The output latches are used to avoid interference with ongoing operations. That is, since the column select signals output from the third stage 330 may be configured to update on the rising edge of CLK, where the current operation will have just started to close, latches on all the signals have been added with a local clocking signal gtp as the CLK. If GTP is high (which means the current operation is ongoing), the new NYR signals will not update inside the memory's control circuit.

Figure 5:
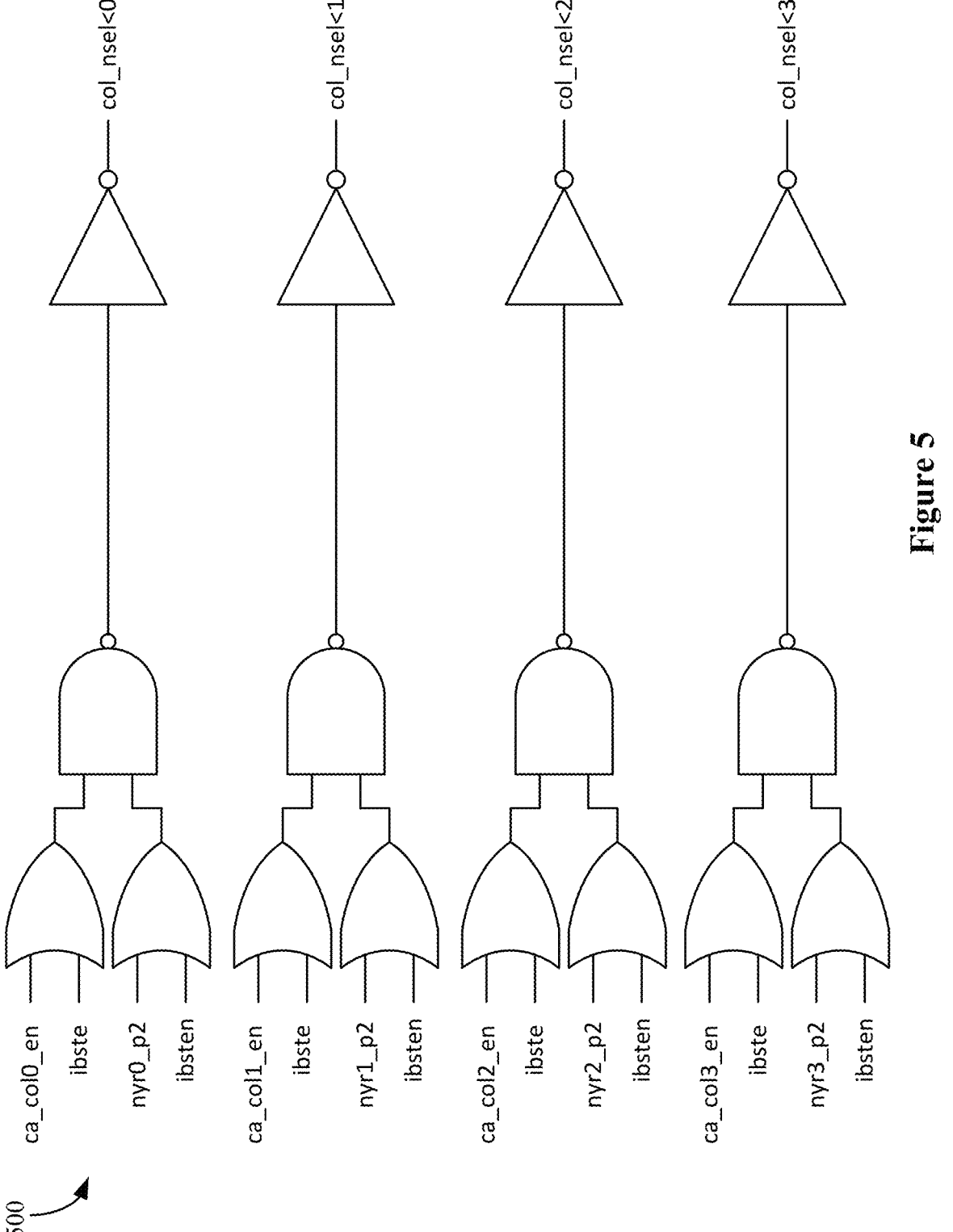
FIG. 5 shows an example read column-select control signal generation circuit that supports in order and out of order column selects.

As illustrated in FIG. 5, the circuitry described above merges easily with the usual control circuitry, in which column addresses (A[0] and A[1] for a mux=4 instance) determine which NYR is to be selected by simple multiplexers triggered by BSTEN. FIG. 5 shows an example read column-select control signal generation circuit that supports in order and out of order column selects. Referring to FIG. 5, a set of multiplexers are coupled to the available columns of the blast operation, each multiplexer selectable between the column select signal for triggering the appropriate column during a particular clock cycle indicated by the cycle number signal for the blast operation and a single column address for a conventional operation. The circuit of FIG. 5 can be used to control the complex column mux shown in the circuitry 120A of FIG. 1B. As mentioned above, out of order column selection refers to the ability to select/access non-consecutive columns in a blast operation.

Figure 6:
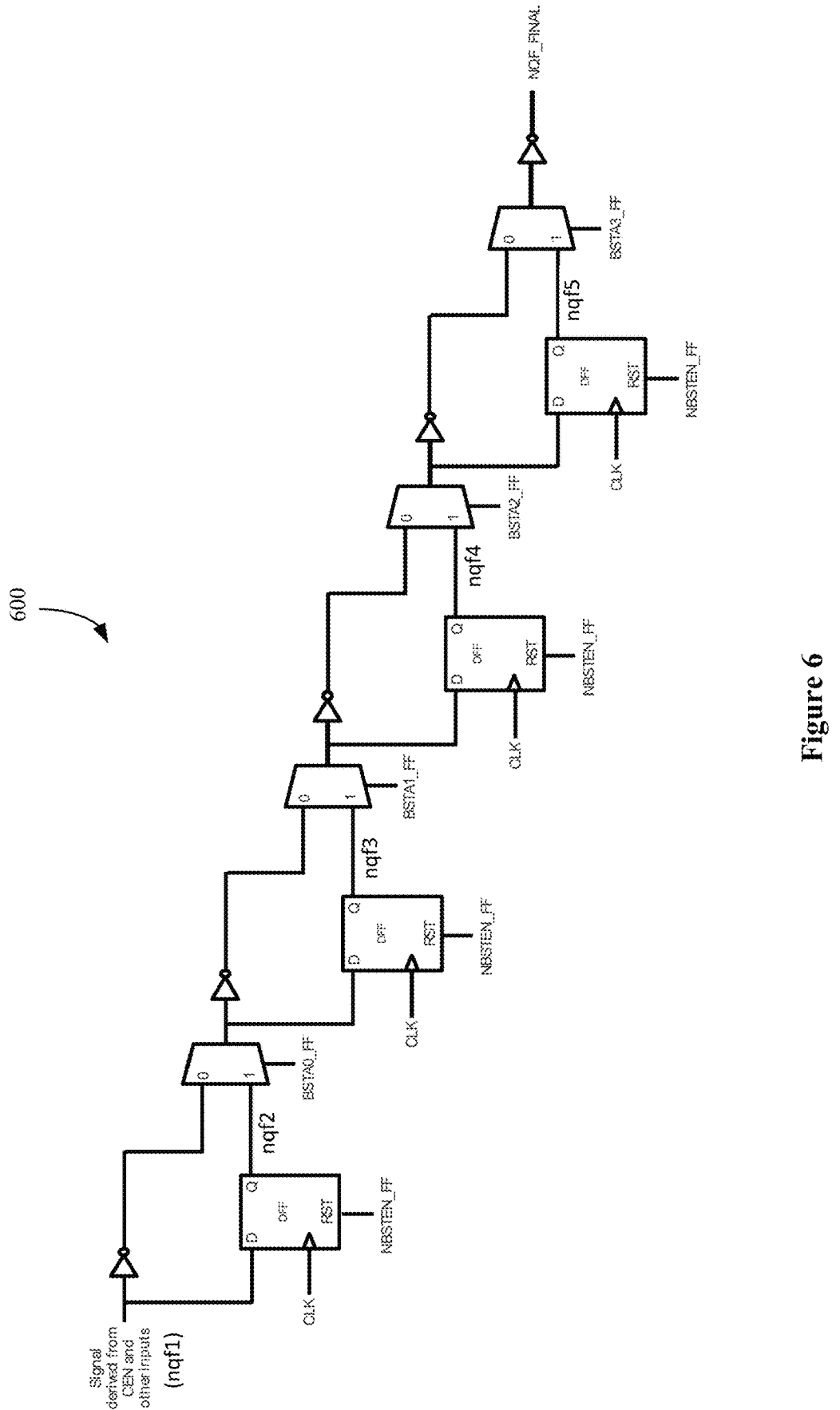
FIG. 6 shows a simplified state machine diagram.

FIG. 6 shows a simplified state machine diagram. In FIG. 6, a simple representation of a state machine 600 is shown that can be implemented in the control circuit for a memory such as described with respect to FIGS. 1A, 1B, 2, 3A, and 3B. The signals output by state machine 600 (i.e., nqf2, nqf3, nqf4, nqf5) can be used by the circuit shown in FIG. 3A. Referring to FIG. 6, the state machine 600 includes four state elements using four shift registers and four multiplexers, each multiplexer disposed between stages of the state machine. The blast enable signal (BSTEN) can be used to reset the shift registers (e.g., based on a value captured into a flip-flop—not shown). The value on the address select signal (e.g., BSTA [3:0]) can also be captured into flip-flops (not shown) in a first clock cycle. The values captured into the flip-flops are output as BSTA0_FF, BSTA1_FF, BSTA2_FF, and BSTA3_FF and used to control the four multiplexes located between the states of the state machine. For any multiplexer, if the control line is '1', then there is a delay of 1 clock cycle before the output updates. If the control line is '0', then the output updates in the same clock cycle. Therefore, if BSTA=1001, then NQF_FINAL toggles in 2 cycles (since there are 2 ones in the BSTA); and if BSTA=1111, then NQF_FINAL toggles in 4 cycles (since there are 4 ones in the BSTA).

In order to not lose the information in the state machine registers from a reset operation, a selective resetting of the state machine registers is made possible by a circuit that allows the reset pulse to be generated only in response to the first clock operation in a multi-cycle operation. That is, a circuit is provided that blocks the reset signal from generating repeatedly in response to the precharge operations occurring in the subsequent clock cycles for the multi-cycle operations of a blast read and blast write. A selective reset circuit for the state elements of the state machine resets the state machine upon receipt of an operation enable signal (e.g., based on CEN) that indicates an initial cycle for starting the blast operation. The selective reset circuit can be inhibited from resetting the state machine during subsequent cycles of the blast operation. The selective reset circuit generates a pulse using a clock edge for a precharge signal triggered during the initial cycle.

Figure 7:
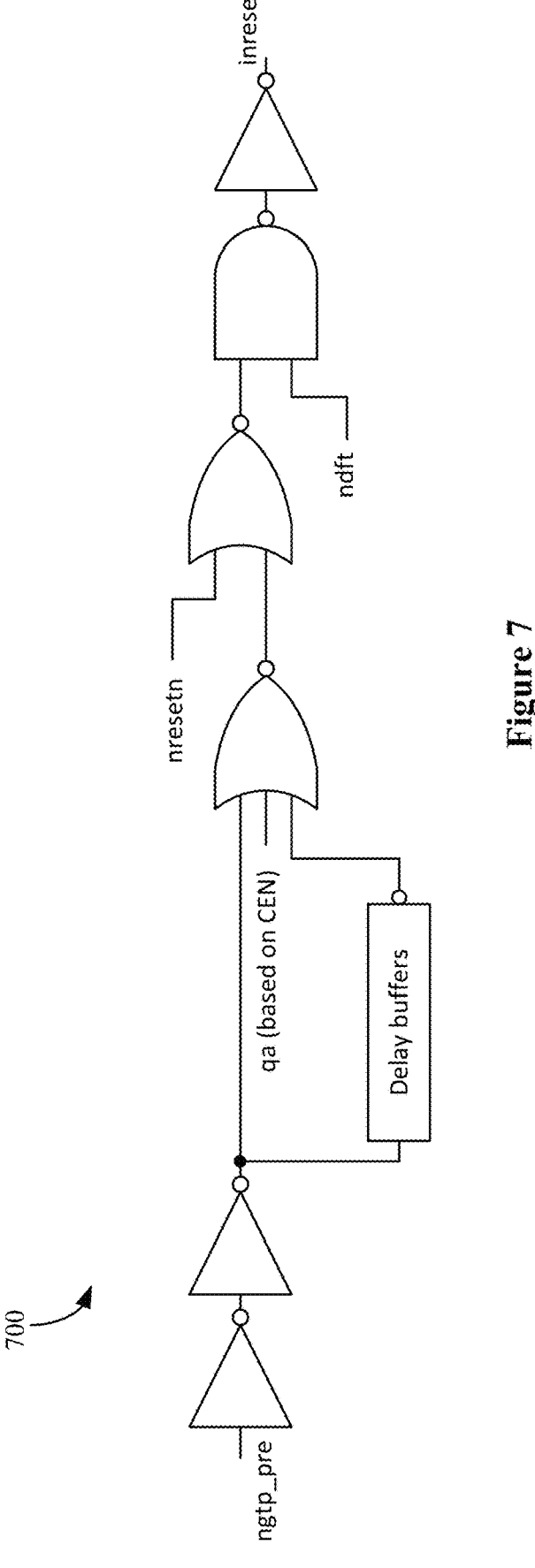
FIG. 7 shows an example selective reset circuit.

FIG. 7 shows an example selective reset circuit. As illustrated in FIG. 7, the selective reset circuit can include a NOR gate that receives the precharge signal (e.g., which may be used for precharging bitlines and sense-amplifier), a delayed signal of the precharge signal, and the operation enable signal to generate a pulse. This circuit (and the operation enable signal of qa which is based on CEN) causes the reset pulse that generates to reset the state machine to be generated only for the first clock in a multi-cycle operation. For example, with reference to FIG. 6, the blast enable signal captured in a flip-flop (not shown) can be kept at the appropriate value through the use of the selective reset circuit and thus avoiding a reset on every precharge signal operation.

Certain embodiments of the illustrated methods and memory circuitry include the following.

Clause 1. A control circuit comprising: a state machine comprising a number of state elements corresponding to a maximum number of available columns of a blast operation for memory, wherein the state machine is structured to receive a clock and an input associated with a start of memory operations and to output intermediate state element outputs and a final state element output; a set of registers comprising a corresponding register for each state element such that the set of registers has a number of registers corresponding to the maximum number of available columns of the blast operation for the memory, wherein each register of the set of registers is available to store, from an address enable signal, a value indicating that a column in memory to which that register corresponds is to be accessed; and a column selection control circuit that combines outputs of the state machine and the set of registers to trigger an appropriate column during an appropriate clock cycle, available at a start of a corresponding clock cycle.

Clause 2. The control circuit of clause 1, wherein the address enable signal indicates non-consecutive columns to be written or read, whereby a state of the set of registers directs the column selection control circuit to trigger non-consecutive columns during consecutive clock cycles.

Clause 3. The control circuit of clause 1 or 2, where the column selection control circuit comprises: a first stage combining outputs of the set of registers with outputs of the state machine to generate position signals for each register value of the set of registers; a second stage comprising logic structured to receive position signals from the first stage and outputs of the set of registers and output a cycle number signal; and a third stage comprising logic structured to receive the cycle number signal from the second stage and the outputs of the set of registers and provide a column select signal for triggering an appropriate column during a particular clock cycle indicated by the cycle number signal and states of the set of registers.

Clause 4. The control circuit of any preceding clause, wherein the number of registers is four.

Clause 5. The control circuit of any preceding clause, wherein, in the first stage: an output of a first register corresponding to a first column position and an intermediate output of a first state machine element are combined to a first position signal; an output of a second register corresponding to a second column position and an intermediate output of a second state machine element are combined to a second position signal; an output of a third register corresponding to a third column position and an intermediate output of a third state machine element are combined to a third position signal; and an output of a fourth register corresponding to a fourth column position and a final output of a fourth state machine element are combined to a fourth position signal.

Clause 6. The control circuit of any preceding clause, wherein the first stage comprises: a first NOR gate structured to receive the output of a first register corresponding to the first column position and the intermediate output of the first state machine element and output the first position signal; a second NOR gate structured to receive the output of the second register corresponding to the second column position and the intermediate output of the second state machine element and output the second position signal; a third NOR gate structured to receive the output of the third register corresponding to the third column position and the intermediate output of the third state machine element and output the third position signal; and a fourth NOR gate structured to receive the output of the fourth register corresponding to the fourth column position and the final output of the fourth state machine element and output the fourth position signal.

Clause 7. The control circuit of any preceding clause, wherein, in the second stage: the cycle number signal for a first cycle is high if the first position signal, the second position signal, and the third position signal are all low; the cycle number signal for a second cycle is high if the first position signal and the output of the first register are both high; the cycle number signal for a third cycle is high if the second position signal and the output of the second register are both high; and the cycle number signal for a fourth cycle is high if the third position signal is high.

Clause 8. The control circuit of any preceding clause, wherein the second stage comprises: a first NOR gate that receives the first position signal, the second position signal, and the third position signal; a first NAND gate that receives the first position signal and the output of the first register; a second NAND gate that receives the second position signal and the output of the second register; and an inverter that receives the third position signal.

Clause 9. The control circuit of any preceding clause, wherein, in the third stage: a first column select signal is triggered if the cycle number signal for a first cycle is high and the output of the first register is high; a second column select signal is triggered if the cycle number signal for the first cycle is high, the output of the first register is not high, and the output of the second register is high; the second column select signal is triggered if the cycle number signal for a second cycle is high and the outputs of the first register and the second register are high; a third column select signal is triggered if the cycle number signal for the first cycle is high, the output of the third register is high, and the outputs of the first register and the second register are not high; the third column select signal is triggered if the cycle number signal for the second cycle is high, the output of the third register is high, the output of the first register is high and the output of the second register is not high; the third column select signal is triggered if the cycle number signal for the second cycle is high, the output of the third register is high, the output of the first register is not high and the output of the second register is high; the third column select signal is triggered if the cycle number signal for a third cycle is high, the outputs of the first register, the second register, and the third register are high; a fourth column select signal is triggered if the cycle number signal for the first cycle is high, the output of the fourth register is high, and the outputs of the first register, the second register, and the third register are not high; the fourth column select signal is triggered if the cycle number signal for the second cycle is high, the output of the fourth register is high, the output of the first register is high, and the outputs of the second register and the third register are not high; the fourth column select signal is triggered if the cycle number signal for the second cycle is high, the output of the fourth register is high, the output of the second register is high, and the outputs of the first register and the third register are not high; the fourth column select signal is triggered if the cycle number signal for the second cycle is high, the output of the fourth register is high, the output of the third register is high, and the outputs of the first register and the second register are not high; the fourth column select signal is triggered if the cycle number signal for the third cycle is high, the outputs of the first register, the second register, and the fourth register are high, and the output of the third register is not high; the fourth column select signal is triggered if the cycle number signal for the third cycle is high, the outputs of the first register, the third register, and the fourth register are high, and the output of the second register is not high; the fourth column select signal is triggered if the cycle number signal for the third cycle is high, the outputs of the second register, the third register, and the fourth register are high, and the output of the first register is not high; and the fourth column select signal is triggered if the cycle number signal for a fourth cycle is high and the outputs of the first register, the second register, the third register, and the fourth register are high.

Clause 10. The control circuit of any preceding clause, wherein the third stage comprises: a NAND gate receiving the cycle number signal for the first cycle and an inverted output of the first register to trigger the first column select signal; a first four-input cascaded logic gate receiving the cycle number signal for the first cycle, the inverted output of the first register, an inverted cycle number signal for the second cycle, and the output of the second register to trigger the second column select signal; a second four-input cascaded logic gate receiving an intermediate output of the first four-input cascaded logic gate, an inverted output of the second register, an inverted cycle number signal for the third cycle, and the output of the third register to trigger the third column select signal; and a third four-input cascaded logic gate receiving an intermediate output of the second four-input cascaded logic gate, an inverted output of the third register, an inverted cycle number signal for the fourth cycle, and the output of the fourth register to trigger the fourth column select signal.

Clause 11. The control circuit of any preceding clause, wherein the first four-input cascaded logic gate, the second four-input cascaded logic gate, and the third four-input cascaded logic gate each comprises: a first two-input NAND gate receiving a first input and a second input of that four-input cascaded logic gate; a second two-input NAND gate receiving an output of the first two-input NAND gate and a third input of that four-input cascaded logic gate; and a third two-input NAND gate receiving an output of the second two-input NAND gate and a fourth input of that four-input cascaded logic gate, wherein the output of the second two-input NAND gate is the intermediate output of that four-input cascaded logic gate.

Clause 12. The control circuit of any preceding clause, further comprising: a first output latch coupled to the output of the NAND gate; a second output latch coupled to the output of the first four-input cascaded logic gate; a third output latch coupled to the output of the second four-input cascaded logic gate; and a fourth output latch coupled to the output of the third four-input cascaded logic gate.

Clause 13. The control circuit of any preceding clause, further comprising: a set of multiplexers coupled to the available columns of the blast operation, each multiplexer selectable between the column select signal for triggering the appropriate column during a particular clock cycle indicated by the cycle number signal for the blast operation and a single column address for a conventional operation.

Clause 14. The control circuit of any preceding clause, further comprising: a selective reset circuit for the state elements of the state machine that resets the state machine upon receipt of an operation enable signal that indicates an initial cycle for starting the blast operation.

Clause 15. The control circuit of clause 14, wherein the selective reset circuit is inhibited from resetting the state machine during subsequent cycles of the blast operation.

Clause 16. The control circuit of clause 14 or 15, wherein the selective reset circuit generates a pulse using a clock edge for a precharge signal triggered during the initial cycle.

Clause 17. The control circuit of any of clauses 14-16, wherein the selective reset circuit comprises: a NOR gate that receives the precharge signal, a delayed signal of the precharge signal, and the operation enable signal to generate a pulse.

Clause 18. A memory circuitry, comprising: a wordline driver for a memory, the wordline driver coupled to receive an address and select a corresponding wordline for the memory; input/output circuitry comprising read circuitry and write circuitry; and a control circuit of any preceding clause, the control circuit for operating the wordline driver and the input/output circuitry, wherein the control circuit comprises: a state machine comprising a number of state elements corresponding to a maximum number of available columns of a blast operation for memory, wherein the state machine is structured to receive a clock and an input associated with a start of memory operations and to output intermediate state element outputs and a final state element output; a set of registers comprising a corresponding register for each state element such that the set of registers has a number of registers corresponding to the maximum number of available columns of the blast operation for the memory, wherein each register of the set of registers is available to store, from an address enable signal, a value indicating that a column in memory to which that register corresponds is to be accessed; and a column selection control circuit that combines outputs of the state machine and the set of registers to trigger an appropriate column during an appropriate clock cycle, available at a start of a corresponding clock cycle.

Clause 19. The memory circuitry of clause 18, wherein the address enable signal indicates non-consecutive columns to be written or read, whereby a state of the set of registers directs the column selection control circuit to trigger non-consecutive columns during consecutive clock cycles.

Clause 20. The memory circuitry of clause 18 or 19, where the column selection control circuit comprises: a first stage combining outputs of the set of registers with outputs of the state machine to generate position signals for each register value of the set of registers; a second stage comprising logic structured to receive position signals from the first stage and outputs of the set of registers and output a cycle number signal; and a third stage comprising logic structured to receive the cycle number signal from the second stage and the outputs of the set of registers and provide a column select signal for triggering an appropriate column during a particular clock cycle indicated by the cycle number signal and states of the set of registers.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts that would be recognized by one skilled in the art are intended to be within the scope of the claims.

What is claimed is:

1. A control circuit comprising:
a state machine comprising a number of state elements corresponding to a maximum number of available columns of a blast operation for memory, wherein the state machine is structured to receive a clock and an input associated with a start of memory operations and to output intermediate state element outputs and a final state element output;
a set of registers comprising a corresponding register for each state element such that the set of registers has a number of registers corresponding to the maximum number of available columns of the blast operation for the memory, wherein each register of the set of registers is available to store, from an address enable signal, a value indicating that a column in memory to which that register corresponds is to be accessed; and
a column selection control circuit that combines outputs of the state machine and the set of registers to trigger an appropriate column during an appropriate clock cycle, available at a start of a corresponding clock cycle.

2. The control circuit of claim 1, wherein the address enable signal indicates non-consecutive columns to be written or read, whereby a state of the set of registers directs the column selection control circuit to trigger non-consecutive columns during consecutive clock cycles.

3. The control circuit of claim 1, where the column selection control circuit comprises:
a first stage combining outputs of the set of registers with outputs of the state machine to generate position signals for each register value of the set of registers;
a second stage comprising logic structured to receive position signals from the first stage and outputs of the set of registers and output a cycle number signal; and
a third stage comprising logic structured to receive the cycle number signal from the second stage and the outputs of the set of registers and provide a column select signal for triggering an appropriate column during a particular clock cycle indicated by the cycle number signal and states of the set of registers.

4. The control circuit of claim 3, wherein the number of registers is four.

5. The control circuit of claim 4, wherein, in the first stage:
an output of a first register corresponding to a first column position and an intermediate output of a first state machine element are combined to a first position signal;
an output of a second register corresponding to a second column position and an intermediate output of a second state machine element are combined to a second position signal;
an output of a third register corresponding to a third column position and an intermediate output of a third state machine element are combined to a third position signal; and
an output of a fourth register corresponding to a fourth column position and a final output of a fourth state machine element are combined to a fourth position signal.

6. The control circuit of claim 5, wherein the first stage comprises:
a first NOR gate structured to receive the output of a first register corresponding to the first column position and the intermediate output of the first state machine element and output the first position signal;
a second NOR gate structured to receive the output of the second register corresponding to the second column position and the intermediate output of the second state machine element and output the second position signal;
a third NOR gate structured to receive the output of the third register corresponding to the third column position and the intermediate output of the third state machine element and output the third position signal; and
a fourth NOR gate structured to receive the output of the fourth register corresponding to the fourth column position and the final output of the fourth state machine element and output the fourth position signal.

7. The control circuit of claim 5, wherein, in the second stage:

the cycle number signal for a first cycle is high if the first position signal, the second position signal, and the third position signal are all low;

the cycle number signal for a second cycle is high if the first position signal and the output of the first register are both high;

the cycle number signal for a third cycle is high if the second position signal and the output of the second register are both high; and the cycle number signal for a fourth cycle is high if the third position signal is high.

8. The control circuit of claim 5, wherein the second stage comprises:

a first NOR gate that receives the first position signal, the second position signal, and the third position signal;

a first NAND gate that receives the first position signal and the output of the first register;

a second NAND gate that receives the second position signal and the output of the second register; and an inverter that receives the third position signal.

9. The control circuit of claim 5, wherein, in the third stage:

a first column select signal is triggered if the cycle number signal for a first cycle is high and the output of the first register is high;

a second column select signal is triggered if the cycle number signal for the first cycle is high, the output of the first register is not high, and the output of the second register is high;

the second column select signal is triggered if the cycle number signal for a second cycle is high and the outputs of the first register and the second register are high;

a third column select signal is triggered if the cycle number signal for the first cycle is high, the output of the third register is high, and the outputs of the first register and the second register are not high;

the third column select signal is triggered if the cycle number signal for the second cycle is high, the output of the third register is high, the output of the first register is high and the output of the second register is not high;

the third column select signal is triggered if the cycle number signal for the second cycle is high, the output of the third register is high, the output of the first register is not high and the output of the second register is high;

the third column select signal is triggered if the cycle number signal for a third cycle is high, the outputs of the first register, the second register, and the third register are high;

a fourth column select signal is triggered if the cycle number signal for the first cycle is high, the output of the fourth register is high, and the outputs of the first register, the second register, and the third register are not high;

the fourth column select signal is triggered if the cycle number signal for the second cycle is high, the output of the fourth register is high, the output of the first register is high, and the outputs of the second register and the third register are not high;

the fourth column select signal is triggered if the cycle number signal for the second cycle is high, the output of the fourth register is high, the output of the second register is high, and the outputs of the first register and the third register are not high;

the fourth column select signal is triggered if the cycle number signal for the second cycle is high, the output of the fourth register is high, the output of the third register is high, and the outputs of the first register and the second register are not high;

the fourth column select signal is triggered if the cycle number signal for the third cycle is high, the outputs of the first register, the second register, and the fourth register are high, and the output of the third register is not high;

the fourth column select signal is triggered if the cycle number signal for the third cycle is high, the outputs of the first register, the third register, and the fourth register are high, and the output of the second register is not high;

the fourth column select signal is triggered if the cycle number signal for the third cycle is high, the outputs of the second register, the third register, and the fourth register are high, and the output of the first register is not high; and the fourth column select signal is triggered if the cycle number signal for a fourth cycle is high and the outputs of the first register, the second register, the third register, and the fourth register are high.

10. The control circuit of claim 9, wherein the third stage comprises:

a NAND gate receiving the cycle number signal for the first cycle and an inverted output of the first register to trigger the first column select signal;

a first four-input cascaded logic gate receiving the cycle number signal for the first cycle, the inverted output of the first register, an inverted cycle number signal for the second cycle, and the output of the second register to trigger the second column select signal;

a second four-input cascaded logic gate receiving an intermediate output of the first four-input cascaded logic gate, an inverted output of the second register, an inverted cycle number signal for the third cycle, and the output of the third register to trigger the third column select signal; and a third four-input cascaded logic gate receiving an intermediate output of the second four-input cascaded logic gate, an inverted output of the third register, an inverted cycle number signal for the fourth cycle, and the output of the fourth register to trigger the fourth column select signal.

11. The control circuit of claim 10, wherein the first four-input cascaded logic gate, the second four-input cascaded logic gate, and the third four-input cascaded logic gate each comprises:

a first two-input NAND gate receiving a first input and a second input of that four-input cascaded logic gate;

a second two-input NAND gate receiving an output of the first two-input NAND gate and a third input of that four-input cascaded logic gate; and a third two-input NAND gate receiving an output of the second two-input NAND gate and a fourth input of that four-input cascaded logic gate, wherein the output of the second two-input NAND gate is the intermediate output of that four-input cascaded logic gate.

12. The control circuit of claim 10, further comprising:

a first output latch coupled to the output of the NAND gate;

17 a second output latch coupled to the output of the first four-input cascaded logic gate;

a third output latch coupled to the output of the second four-input cascaded logic gate; and a fourth output latch coupled to the output of the third four-input cascaded logic gate.

13. The control circuit of claim 3, further comprising:

a set of multiplexers coupled to the available columns of the blast operation, each multiplexer selectable between the column select signal for triggering the appropriate column during a particular clock cycle indicated by the cycle number signal for the blast operation and a single column address for a conventional operation.

14. The control circuit of claim 1, further comprising:

a selective reset circuit for the state elements of the state machine that resets the state machine upon receipt of an operation enable signal that indicates an initial cycle for starting the blast operation.

15. The control circuit of claim 14, wherein the selective reset circuit is inhibited from resetting the state machine during subsequent cycles of the blast operation.

16. The control circuit of claim 14, wherein the selective reset circuit generates a pulse using a clock edge for a precharge signal triggered during the initial cycle.

17. The control circuit of claim 16, wherein the selective reset circuit comprises:

a NOR gate that receives the precharge signal, a delayed signal of the precharge signal, and the operation enable signal to generate a pulse.

18. A memory circuitry, comprising:

a wordline driver for a memory, the wordline driver coupled to receive an address and select a corresponding wordline for the memory;

input/output circuitry comprising read circuitry and write circuitry; and a control circuit for operating the wordline driver and the input/output circuitry, wherein the control circuit comprises:

a state machine comprising a number of state elements corresponding to a maximum number of available columns of a blast operation for memory, wherein the state machine is structured to receive a clock and an input associated with a start of memory operations and to output intermediate state element outputs and a final state element output;

a set of registers comprising a corresponding register for each state element such that the set of registers has a number of registers corresponding to the maximum number of available columns of the blast operation for the memory, wherein each register of the set of registers is available to store, from an address enable signal, a value indicating that a column in memory to which that register corresponds is to be accessed; and a column selection control circuit that combines outputs of the state machine and the set of registers to trigger an appropriate column during an appropriate clock cycle, available at a start of a corresponding clock cycle.

19. The memory circuitry of claim 18, wherein the address enable signal indicates non-consecutive columns to be written or read, whereby a state of the set of registers directs the column selection control circuit to trigger non-consecutive columns during consecutive clock cycles.

20. The memory circuitry of claim 18, where the column selection control circuit comprises:

a first stage combining outputs of the set of registers with outputs of the state machine to generate position signals for each register value of the set of registers;

a second stage comprising logic structured to receive position signals from the first stage and outputs of the set of registers and output a cycle number signal; and a third stage comprising logic structured to receive the cycle number signal from the second stage and the outputs of the set of registers and provide a column select signal for triggering an appropriate column during a particular clock cycle indicated by the cycle number signal and states of the set of registers.

* * * * *